(12) United States Patent
Ichikura et al.

(10) Patent No.: US 9,537,505 B2
(45) Date of Patent: Jan. 3, 2017

(54) DATA PROCESSING APPARATUS AND METHOD OF PROCESSING DATA

(71) Applicant: LAPIS SEMICONDUCTOR CO., LTD., Kanagawa (JP)

(72) Inventors: Hiroyoshi Ichikura, Kanagawa (JP); Kunihiro Harayama, Kanagawa (JP); Hideaki Hasegawa, Kanagawa (JP)

(73) Assignee: LAPIS SEMICONDUCTOR CO., LTD., Kanagawa (JP)

( * ) Notice: Subject to any disclaimer, the term of this patent is extended or adjusted under 35 U.S.C. 154(b) by 0 days.

(21) Appl. No.: 14/847,281

(22) Filed: Sep. 8, 2015

(65) Prior Publication Data

US 2016/0072522 A1    Mar. 10, 2016

(30) Foreign Application Priority Data

Sep. 8, 2014   (JP) ................. 2014-182024

(51) Int. Cl.
  *H03M 9/00*   (2006.01)
  *H03K 3/037*   (2006.01)

(52) U.S. Cl.
  CPC ............... *H03M 9/00* (2013.01); *H03K 3/037* (2013.01)

(58) Field of Classification Search
  CPC .......... G05B 2219/35545; G05B 2219/40254; H03M 9/00; H03M 1/12
  USPC ....................................... 341/100
  See application file for complete search history.

(56) References Cited

U.S. PATENT DOCUMENTS 7,675,439 B2 * 3/2010 Chang ............... H03M 9/00
                                                    341/100
7,924,186 B2 * 4/2011 Diab ................. H04L 7/0004
                                                    341/100

FOREIGN PATENT DOCUMENTS

JP          2009-163269 A       7/2009

* cited by examiner

*Primary Examiner* — Jean B Jeanglaude
(74) *Attorney, Agent, or Firm* — Kubotera & Associates, LLC

(57) ABSTRACT

A data processing apparatus includes an inputting portion; a first retrieving portion; a second retrieving portion; a clock determining portion; a first serial parallel converting portion; a second serial parallel converting portion; and a combining portion. The inputting portion receives a serial data including a clock bit. The first retrieving portion obtains a first retrieved data. The second retrieving portion obtains a second retrieved data. The clock determining portion determines whether the clock bit is included in the first retrieved data or the second retrieved data. The first serial parallel converting portion performs parallel conversion to obtain a first parallel data. The second serial parallel converting portion performs parallel conversion to obtain a second parallel data. The combining portion combines the first parallel data and the second parallel data to output a parallel data.

14 Claims, 6 Drawing Sheets

DATA PROCESSING APPARATUS AND METHOD OF PROCESSING DATA

BACKGROUND OF THE INVENTION AND RELATED ART STATEMENT

The present invention relates to a data processing apparatus and a method of processing data. In particular, the present invention relates to a data processing apparatus for transmitting data through an embedded clock method.

During serial data transmission, when a data signal and a clock signal are transmitted through separate signal line, there may be a time difference between transmission of the data signal and transmission of the clock signal. In order to prevent the time difference, there has been proposed an embedded clock method, in which the clock signal is overlapped with the data signal to be transmitted (refer to Patent Reference).

Patent Reference: Japanese Patent Publication No. 2009-163269

In general, when serial data is transmitted through data communication, a reception side device performs a process for converting the serial data to parallel (a serial parallel conversion). When the serial data communication is performed at a high speed, it is necessary to provide a large number of latches capable of operating a high speed clock so as to apply the serial parallel conversion to the serial data at a high speed. Accordingly, due to a delay during latching, there may be a time difference (a skew) during processing a large amount of data to be processed concurrently.

In view of the problems of the conventional technique described above, an object of the present invention is to provide a data processing apparatus capable of minimizing the skew caused by the delay during latching and the like during the data communication when data is transmitted with the embedded clock method.

Further objects and advantages of the invention will be apparent from the following description of the invention.

SUMMARY OF THE INVENTION

In order to attain the objects described above, according to a first aspect of the present invention, a data processing apparatus includes an inputting portion; a first retrieving portion; a second retrieving portion; a clock determining portion; a first serial parallel converting portion; a second serial parallel converting portion; and a combining portion.

According to the first aspect of the present invention, the inputting portion is configured to receive a serial data formed of a sequence of serial data blocks of N bits (N is a natural number greater than 2) and including a clock bit. The first retrieving portion is configured to retrieve and obtain a data of K bits (K is a natural number greater than N, K>N) from each of the serial data blocks as a first retrieved data. The second retrieving portion is configured to retrieve and obtain a data of L bits (L is a difference between N and K, L=K−N) from each of the serial data blocks as a second retrieved data. The clock determining portion is configured to determine whether the clock bit is included in one of the first retrieved data and the second retrieved data.

According to the first aspect of the present invention, the first serial parallel converting portion is configured to perform parallel conversion to one of the first retrieved data and the second retrieved data that includes the clock bit according to a determination result of the clock determining portion, so that the first serial parallel converting portion obtains a first parallel data. The second serial parallel converting portion is configured to perform parallel conversion to the other one of the first retrieved data and the second retrieved data that does not include the clock bit according to the determination result of the clock determining portion, so that the second serial parallel converting portion obtains a second parallel data. The combining portion is configured to combine the first parallel data and the second parallel data to output a parallel data of N bits.

According to a second aspect of the present invention, a method of processing data includes an input receiving step; a first retrieving step; a second retrieving portion; a clock determining step; a first serial parallel converting step; a second serial parallel converting step; and a combining step.

According to the second aspect of the present invention, in the input receiving step, a serial data formed of a sequence of serial data blocks of N bits (N is a natural number greater than 2) and including a clock bit is received. In the first retrieving step, a data of K bits (K is a natural number greater than N, K>N) is retrieved and obtained from each of the serial data blocks as a first retrieved data. In the second retrieving step, a data of L bits (L is a difference between N and K, L=K−N) is retrieved and obtained from each of the serial data blocks as a second retrieved data. In the clock determining step, it is determined whether the clock bit is included in one of the first retrieved data and the second retrieved data.

According to the second aspect of the present invention, in the first serial parallel converting step, parallel conversion is performed to one of the first retrieved data and the second retrieved data that includes the clock bit according to a determination result of the clock determining portion, so that a first parallel data is obtained. In the second serial parallel converting step, parallel conversion is performed to the other one of the first retrieved data and the second retrieved data that does not include the clock bit according to the determination result of the clock determining portion, so that a second parallel data is obtained. In the combining step, the first parallel data and the second parallel data are combined, and a parallel data of N bits is output.

According to the present invention, in the data processing apparatus, the serial data is divided into a plurality of paths and retrieved. In parallel to the process, the parallel data are combined after the serial parallel conversion. Accordingly, it is possible to perform the serial parallel conversion at a slower speed. As a result, it is possible to minimize an influence of the skew of the data processing due to the delay during latching.

DETAILED DESCRIPTION OF PREFERRED EMBODIMENTS

Hereunder, preferred embodiments of the present invention will be explained with reference to the accompanying drawings.

First Embodiment

Figure 1:
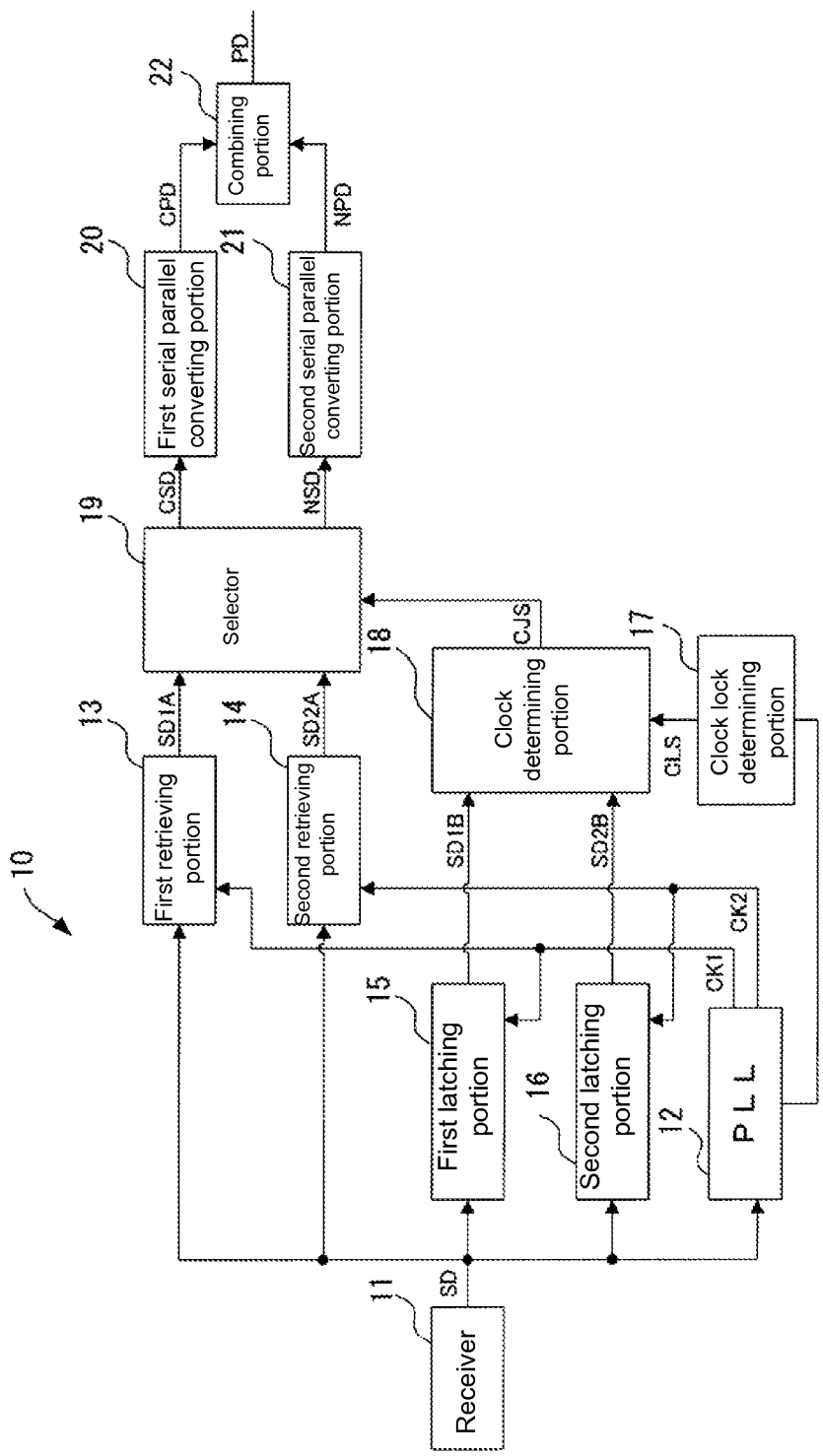
FIG. 1 is a block diagram showing a configuration of a data processing apparatus according to a first embodiment of the present invention.

A first embodiment of the present invention will be explained. FIG. 1 is a block diagram showing a configuration of a data processing apparatus 10 according to the first embodiment of the present invention.

As shown in FIG. 1, the data processing apparatus 10 includes a receiver 11 as an inputting portion for receiving a serial data; a phase locked loop (PLL) circuit 12 as a clock signal generating portion; a first retrieving portion 13; a second retrieving portion 14; a first latching portion 15; a second latching portion 16; a clock lock determining portion 17; a clock determining portion 18; a selector 19 as a connecting switching portion; a first serial parallel converting portion 20; a second serial parallel converting portion 21; and a combining portion 22.

In the first embodiment, the receiver 11 is configured to receive a signal transmitted from an external transmission device (not shown) and the like, so that the receiver 11 obtains a serial data SD having a sequence of serial data blocks DB and including a clock bit AD. For example, when each of the serial data blocks DB is 10 bits, each of the serial data blocks DB is formed of the clock bit AD and 9 bits of data sequence (B1, B2, B3, B4, B5, B6, B7, B8, and B9). Further, the receiver 11 is configured to supply the serial data SD to the PLL circuit 12, the first retrieving portion 13, the second retrieving portion 14, the first latching portion 15, and the second latching portion 16.

In the first embodiment, the PLL circuit 12 is formed of a voltage control oscillator, a phase comparator, a loop filter, and the like. Further, the PLL circuit 12 is configured to generate a first clock signal CK1 having a phase synchronized with that of the clock bit AD in the serial data SD supplied from the receiver 11, and to generate a second clock signal CK2 having a phase inverted from that of the first clock signal CK1. Accordingly, the PLL circuit 12 is configured to supply the first clock signal CK1 to the first retrieving portion 13 and the first latching portion 15. Further, the PLL circuit 12 is configured to supply the second clock signal CK2 to the second retrieving portion 14 and the second latching portion 16.

In the first embodiment, the first retrieving portion 13 and the second retrieving portion 14 are configured to alternately retrieve the data sequence constituting each of the serial data blocks DB in the serial data SD per one bit according to the first clock signal CK1 and the second clock signal CK2, respectively. Then, the first retrieving portion 13 and the second retrieving portion 14 are configured to sequentially supply the data sequence to the selector 19.

Figure 2:
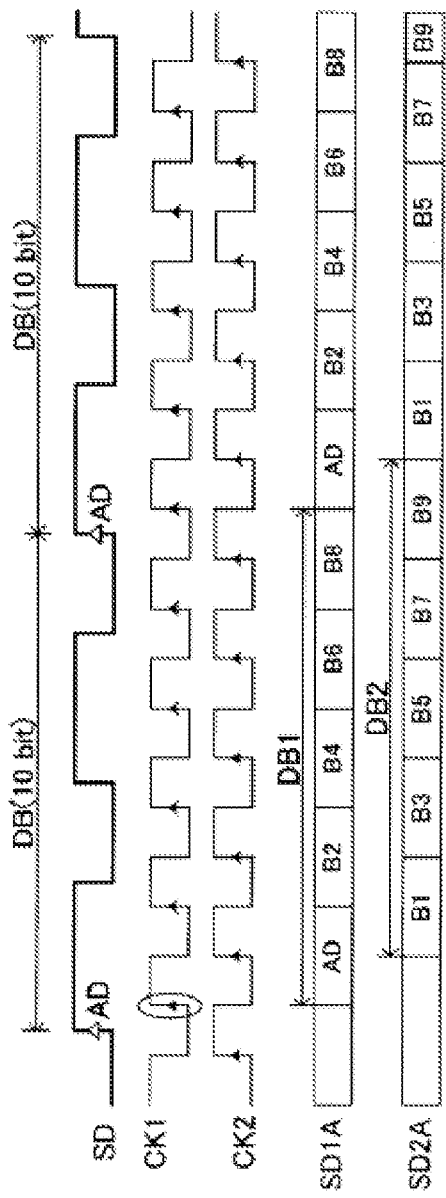
FIGS. 2(a) and 2(b) are time charts showing an operation of a first retrieving portion and a second retrieving portion of the data processing apparatus according to the first embodiment of the present invention.
Figure 2:
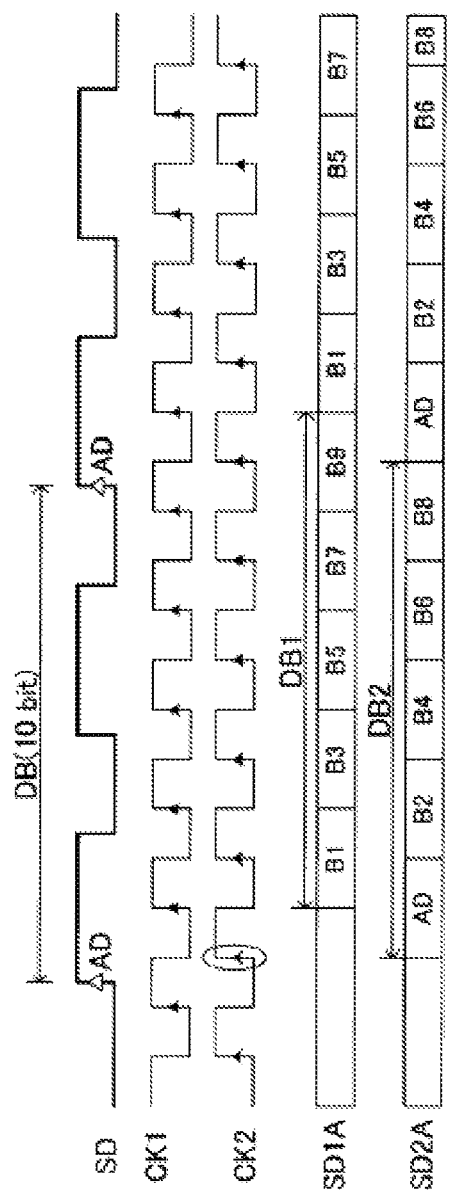

FIGS. 2(a) and 2(b) are time charts showing an operation of the first retrieving portion 13 and the second retrieving portion 14 of the data processing apparatus 10 according to the first embodiment of the present invention.

As shown in FIG. 2(a), after a rising edge of the clock bit AD in the serial data SD appears, when a rising edge of the first clock signal CK1 appears before a rising edge of the second clock signal CK2, the first retrieving portion 13 is configured to sequentially retrieve the clock bit AD and the bits B2, B4, B6, and B8 assigned with even numbers among the data sequence in each of the serial data blocks DB. Then, the first retrieving portion 13 is configured to supply the clock bit AD and the bits B2, B4, B6, and B8 to the selector 19. Similarly, the second retrieving portion 14 is configured to sequentially retrieve the bits B1, B3, B5, B7, and B9 assigned with odd numbers among the data sequence in each of the serial data blocks DB. Then, the second retrieving portion 14 is configured to supply the bits B1, B3, B5, B7, and B9 to the selector 19.

On the other hand, as shown in FIG. 2(b), after the rising edge of the clock bit AD in the serial data SD appears, when the rising edge of the second clock signal CK2 appears before the rising edge of the first clock signal CK1, the first retrieving portion 13 is configured to sequentially retrieve the bits B1, B3, B5, B7, and B9 assigned with odd numbers among the data sequence in each of the serial data blocks DB. Then, the first retrieving portion 13 is configured to supply the bits B1, B3, B5, B7, and B9 to the selector 19. Similarly, the second retrieving portion 14 is configured to sequentially retrieve the clock bit AD and the bits B2, B4, B6, and B8 assigned with even numbers among the data sequence in each of the serial data blocks DB. Then, the second retrieving portion 14 is configured to supply the clock bit AD and the bits B2, B4, B6, and B8 to the selector 19.

Accordingly, in the first embodiment, after the rising edge of the clock bit AD in the serial data SD appears, one of the first retrieving portion 13 and the second retrieving portion 14 retrieves the clock bit AD and the bits B2, B4, B6, and B8 according to one of the first clock signal CK1 and the second clock signal CK2 with the rising edge appearing first. The other one of the first retrieving portion 13 and the second retrieving portion 14 retrieves the bits B1, B3, B5, B7, and B9 according to the other one of the first clock signal CK1 and the second clock signal CK2 with the rising edge appearing later. Through the operation described above, the first retrieving portion 13 supplies a serial data SD1A formed of the sequence of a first data block DB1 including the data retrieved with the first retrieving portion 13 to the selector 19. Similarly, the second retrieving portion 14 supplies a serial data SD2A formed of the sequence of a second data block DB2 including the data retrieved with the second retrieving portion 14 to the selector 19.

In the first embodiment, the first latching portion 15 and the second latching portion 16 are configured to alternately latch the data sequence constituting each of the serial data blocks DB in the serial data SD per one bit according to the first clock signal CK1 and the second clock signal CK2, respectively. Then, the first latching portion 15 and the second latching portion 16 are configured to sequentially supply the data sequence to the clock determining portion 18.

More specifically, in the first embodiment, similar to the first retrieving portion 13 and the second retrieving portion 14, after the rising edge of the clock bit AD in the serial data SD appears, one of the first latching portion 15 and the second latching portion 16 latches the clock bit AD and the bits B2, B4, B6, and B8 according to one of the first clock signal CK1 and the second clock signal CK2 with the rising edge appearing first. The other one of the first latching portion 15 and the second latching portion 16 latches the bits B1, B3, B5, B7, and B9 according to the other one of the first clock signal CK1 and the second clock signal CK2 with the rising edge appearing later. Through the operation described above, the first latching portion 15 supplies a serial data SD1B formed of the data latched with the first latching portion 15 to the clock determining portion 18. Similarly, the second latching portion 16 supplies a serial data SD2B formed of the data latched with the second latching portion 16 to the selector 19.

In the first embodiment, the clock lock determining portion 17 is configured to generate a clock lock signal CLS representing whether the PLL circuit 12 is generating the first clock signal CK1 (or the second clock signal CK2) with the phase thereof locked to that of the clock bit AD. Further, the clock lock determining portion 17 is configured to supply the clock lock signal CLS to the clock determining portion 18. Since the clock determining portion 18 is disposed at a later stage, it is necessary to perform the determining operation of the clock determining portion 18 after the PLL circuit 12 locks the phase relative to the clock bit AD. Accordingly, the clock determining portion 18 is configured to wait for the clock lock signal CLS indicating that the phase is locked from the clock lock determining portion 17 before the clock determining portion 18 performs the determining operation.

In the first embodiment, the clock determining portion 18 is configured to determine which of the serial data SD1B supplied from the first latching portion 15 or the serial data SD2B supplied from the second latching portion 16 contains the clock bit AD according to the clock lock signal CLS indicating that the phase is locked. More specifically, the clock determining portion 18 is configured to compare the rising edges of the serial data SD1B and the serial data SD2B. Then, the clock determining portion 18 determines that one of the serial data SD1B and the serial data SD2B with the rising edge first (becoming a high level first) contains the clock bit AD.

Figure 3:
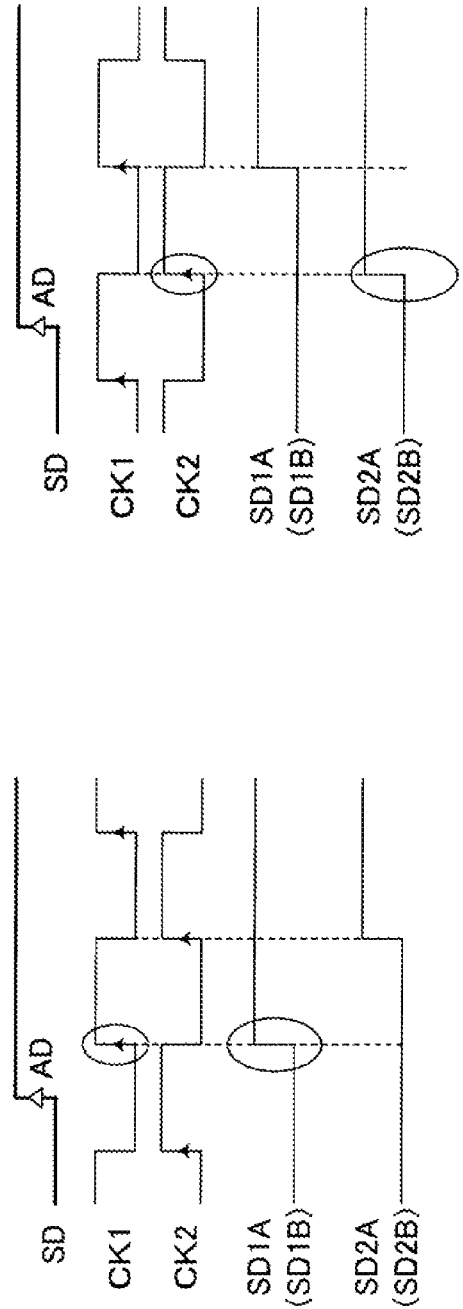
FIGS. 3(a) and 3(b) are time charts showing an operation of a clock determining portion of the data processing apparatus according to the first embodiment of the present invention.

FIGS. 3(a) and 3(b) are time charts showing the operation of the clock determining portion 18 of the data processing apparatus 10 according to the first embodiment of the present invention.

As shown in FIG. 3(a), when the rising edge of the serial data SD1B appears before the rising edge of the serial data SD2B, the clock determining portion 18 is configured to determine that the clock bit AD is contained in the serial data SD1B. On the other hand, when the rising edge of the serial data SD2B appears before the rising edge of the serial data SD1B, the clock determining portion 18 is configured to determine that the clock bit AD is contained in the serial data SD2B.

It should be noted that the serial data SD1A and the serial data SD1B are obtained through latching (retrieving) the data sequence constituting the serial data SD according to the first clock signal CK1. Further, the serial data SD2A and the serial data SD2B are obtained through latching (retrieving) the data sequence constituting the serial data SD according to the second clock signal CK2. Accordingly, when the clock determining portion 18 determines that the clock bit AD is contained in the serial data SD1B, it would be equivalent to the clock determining portion 18 determining that the clock bit AD is contained in the serial data SD1A. Similarly, when the clock determining portion 18 determines that the clock bit AD is contained in the serial data SD2B, it would be equivalent to the clock determining portion 18 determining that the clock bit AD is contained in the serial data SD2A.

More specifically, in the first embodiment, the clock determining portion 18 determines whether the serial data SD1A or the serial data SD2A contains the clock bit AD according to whether the serial data SD1B or the serial data SD2B contains the clock bit AD. Afterward, the clock determining portion 18 supplies a clock determining signal CJS indicating that one of the serial data SD1A (the serial data SD1B) or the serial data SD2A (the serial data SD2B) contains the clock bit AD to the selector 19.

In the first embodiment, after the clock determining portion 18 determines that one of the serial data SD1A and the serial data SD2A contains the clock bit AD, the selector 19 is configured to supply the one of the serial data SD1A and the serial data SD2A as a serial data CSD to the first serial parallel converting portion 20 according to the clock determining signal CJS. Further, the selector 19 is configured to supply the other one of the serial data SD1A and the serial data SD2A not containing the clock bit AD as a serial data NSD to the second serial parallel converting portion 21.

In the first embodiment, the first serial parallel converting portion 20 is configured to perform serial parallel conversion to the serial data CSD containing the clock bit AD and supplied from the selector 19. Accordingly, the first serial parallel converting portion 20 generates a parallel data CPD containing the clock bit AD, and supplies the parallel data CPD to the combining portion 22. Similarly, the second serial parallel converting portion 21 is configured to perform serial parallel conversion to the serial data NSD not containing the clock bit AD and supplied from the selector 19. Accordingly, the second serial parallel converting portion 21 generates a parallel data NPD not containing the clock bit AD, and supplies the parallel data NPD to the combining portion 22.

It should be noted that there is a specific time difference (a delay) between the serial parallel conversion performed to the serial data CSD containing the clock bit AD and the serial parallel conversion performed to the serial data NSD not containing the clock bit AD. More specifically, as shown in FIGS. 2(a) and 2(b), the data block DB1 containing the clock bit AD is output before the data block DB2 not containing the clock bit AD. Further, the data block DB1 has the bit number (the bit number of the bits B2, B4, B6, and B8 except the clock bit AD) smaller than the bit number (the bit number of the bits B1, B3, B5, B7, and B9) of the data block DB2. Accordingly, the first serial parallel converting portion 20 completes the serial parallel conversion before the second serial parallel converting portion 21 completes the serial parallel conversion. To this end, the first serial parallel converting portion 20 is configured to output the parallel data CPD after the delay is adjusted. As a result, after the serial parallel conversion is performed, the first serial parallel converting portion 20 and the second serial parallel converting portion 21 supply the parallel data CPD and the parallel data NPD to the combining portion 22 at the same timing.

In the first embodiment, the combining portion 22 is configured to combine the parallel data CPD without the clock bit AD and the parallel data NPD not containing the clock bit AD and supplied from the second serial parallel converting portion 21, and output as a parallel data PD. For example, the combining portion 22 combines the parallel data NPD containing the bits B1, B3, B5, B7, and B9 with the parallel data CPD containing the bits B2, B4, B6, and B8. Then, the combining portion 22 obtains the parallel data PD formed of the bits B1, B2, B3, B4, B5, B6, B7, B8, and B9. In other words, the combining portion 22 combines the four bits of the parallel data CPD output from the second serial parallel converting portion 21 and the five bits of the parallel data NPD output from the combining portion 22, so that the combining portion 22 generates the parallel data PD formed of the nine bits.

As described above, in the data processing apparatus 10 in the first embodiment, the first retrieving portion 13 and the second retrieving portion 14 alternately retrieve the serial data SD every bit. Then, the first serial parallel converting portion 20 and the second serial parallel converting portion 21 perform the serial parallel conversion, and the combining portion 22 combines the parallel data CPD and the parallel data NPD. Accordingly, it is possible to perform the serial parallel conversion at a slower speed after the data length of the serial data SD is divided into half. As a result, it is possible to process the data while minimizing an influence of the skew caused by the delay in latching.

Further, in the first embodiment, when a plurality of elements, i.e., the first serial parallel converting portion 20 and the second serial parallel converting portion 21, performs the serial parallel conversion, the time difference (the delay) may be caused in the processing time between the data containing the clock bit AD and the data not containing the clock bit AD. To this end, it is configured that the clock determining portion 18 determines which data contains the clock bit AD in advance. Then, the first serial parallel converting portion 20 and the second serial parallel converting portion 21 perform the serial parallel conversion to the data containing the clock bit AD and the data not containing the clock bit AD, while the delay is adjusted. Accordingly, it is not necessary to determine which data contains the clock bit AD, and adjust the delay after the first serial parallel converting portion 20 and the second serial parallel converting portion 21 perform the serial parallel conversion. As a result, it is possible to smoothly process the data.

Second Embodiment

Figure 4:
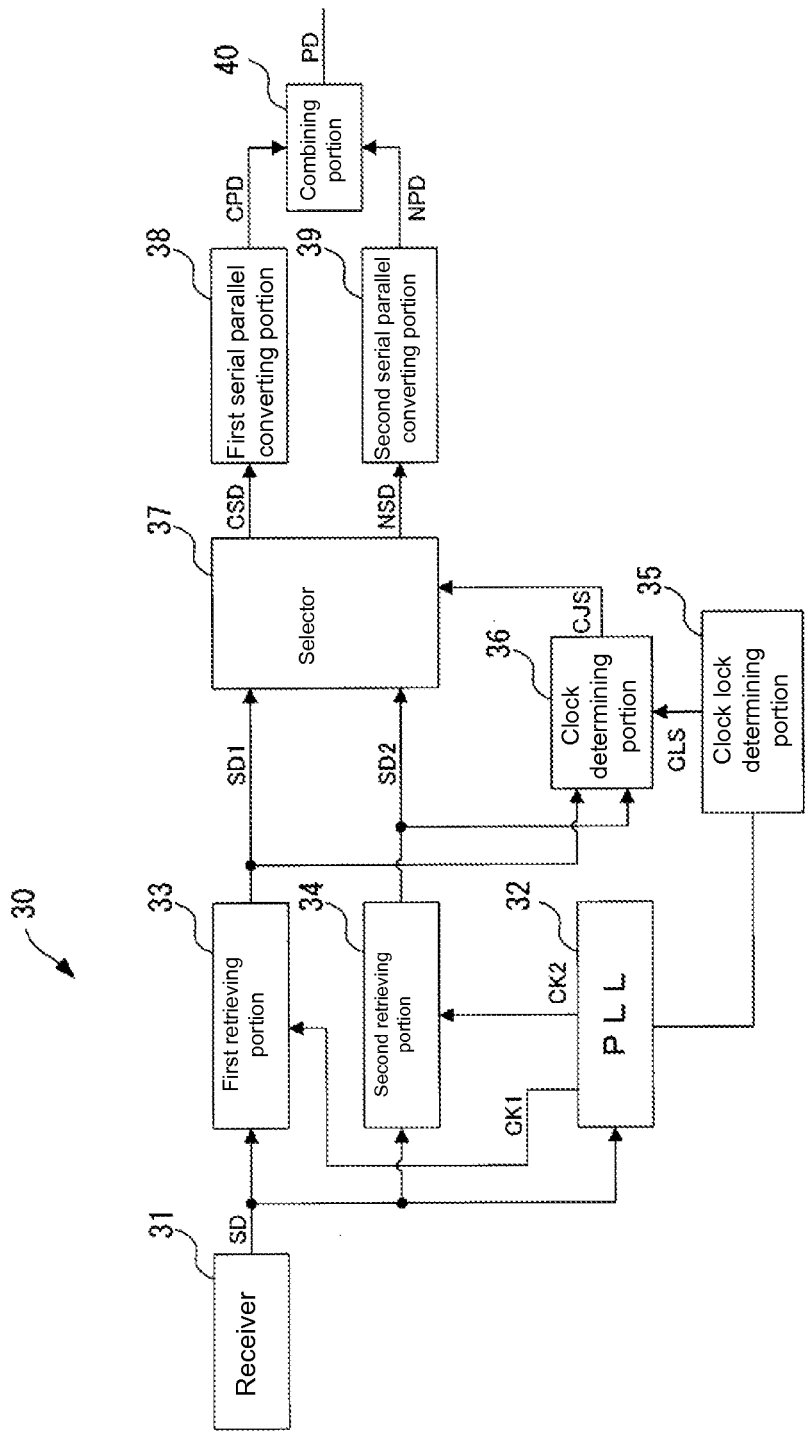
FIG. 4 is a block diagram showing a configuration of a data processing apparatus according to a second embodiment of the present invention.

A second embodiment of the present invention will be explained next. FIG. 4 is a block diagram showing a configuration of a data processing apparatus 30 according to the second embodiment of the present invention.

As shown in FIG. 4, the data processing apparatus 30 includes a receiver 31 as an inputting portion for receiving a serial data; a phase locked loop (PLL) circuit 32 as a clock signal generating portion; a first retrieving portion 33; a second retrieving portion 34; a clock lock determining portion 35; a clock determining portion 36; a selector 37 as a connecting switching portion; a first serial parallel converting portion 38; a second serial parallel converting portion 39; and a combining portion 40.

In the second embodiment, the receiver 31 is configured to receive a signal transmitted from an external transmission device (not shown) and the like, so that the receiver 31 obtains a serial data SD having a sequence of the serial data blocks DB and including the clock bit AD. For example, when each of the serial data blocks DB is 10 bits, each of the serial data blocks DB is formed of the clock bit AD and 9 bits of data sequence (B1, B2, B3, B4, B5, B6, B7, B8, and B9). Further, the receiver 31 is configured to supply the serial data SD to the PLL circuit 32, the first retrieving portion 33, and the second retrieving portion 34.

In the second embodiment, the PLL circuit 32 is configured to generate the first clock signal CK1 having the phase synchronized with that of the clock bit AD in the serial data SD supplied from the receiver 31, and to generate the second clock signal CK2 having the phase inverted from that of the first clock signal CK1. Accordingly, the PLL circuit 32 is configured to supply the first clock signal CK1 to the first retrieving portion 33. Further, the PLL circuit 32 is configured to supply the second clock signal CK2 to the second retrieving portion 34.

In the second embodiment, the first retrieving portion 33 and the second retrieving portion 34 are configured to alternately retrieve the data sequence constituting each of the serial data blocks DB in the serial data SD per one bit according to the first clock signal CK1 and the second clock signal CK2, respectively. Then, the first retrieving portion 13 and the second retrieving portion 14 are configured to sequentially supply the data sequence to the selector 37.

More specifically, after the rising edge of the clock bit AD in the serial data SD appears, one of the first retrieving portion 33 and the second retrieving portion 34 retrieves the clock bit AD and the bits B2, B4, B6, and B8 according to one of the first clock signal CK1 and the second clock signal CK2 with the rising edge appearing first. The other one of the first retrieving portion 33 and the second retrieving portion 34 retrieves the bits B1, B3, B5, B7, and B9 according to the other one of the first clock signal CK1 and the second clock signal CK2 with the rising edge appearing later. Through the operation described above, the first retrieving portion 33 supplies a serial data SD2 formed of the data retrieved with the first retrieving portion 33 to the selector 37. Similarly, the second retrieving portion 34 supplies a serial data SD2 formed of the data retrieved with the second retrieving portion 34 to the selector 37.

In the second embodiment, the clock lock determining portion 35 is configured to generate the clock lock signal CLS representing whether the PLL circuit 32 is generating the first clock signal CK1 (or the second clock signal CK2) with the phase thereof locked to that of the clock bit AD. Further, the clock lock determining portion 35 is configured to supply the clock lock signal CLS to the clock determining portion 36.

In the second embodiment, the clock determining portion 36 is configured to determine which of the serial data SD1 supplied from the first retrieving portion 33 or the serial data SD2 supplied from the second retrieving portion 34 contains the clock bit AD according to the clock lock signal CLS indicating that the phase is locked. Afterward, the clock determining portion 36 supplies the clock determining signal CJS to the selector 37.

In the second embodiment, the first serial parallel converting portion 38 is configured to perform serial parallel conversion to the serial data CSD containing the clock bit AD and supplied from the selector 37. Accordingly, the first serial parallel converting portion 38 generates the parallel data CPD containing the clock bit AD, and supplies the parallel data CPD to the combining portion 40. Similarly, the second serial parallel converting portion 39 is configured to perform serial parallel conversion to the serial data NSD not containing the clock bit AD and supplied from the selector 37. Accordingly, the second serial parallel converting portion 39 generates the parallel data NPD not containing the clock bit AD, and supplies the parallel data NPD to the combining portion 40. It should be noted that the first serial parallel converting portion 38 is configured to adjust the delay, so that the first serial parallel converting portion 38 supplies the parallel data CPD to the combining portion 40 at the same timing as the second serial parallel converting portion 39 supplies the parallel data NPD to the combining portion 40.

In the second embodiment, the combining portion 40 is configured to combine the parallel data CPD without the clock bit AD and the parallel data NPD not containing the clock bit AD and supplied from the second serial parallel converting portion 21, and output as the parallel data PD.

As described above, in the data processing apparatus 30 in the second embodiment, the first retrieving portion 33 and the second retrieving portion 34 supply the retrieved data to not only the selector 37 but also the clock determining portion 36. Then, the clock determining portion 36 determines whether the clock bit AD is contained in the data.

Accordingly, it is possible to eliminate the first latching portion 15 and the second latching portion 16 as disposed in the data processing apparatus 10 in the first embodiment. As a result, it is possible to reduce the device size.

Third Embodiment

Figure 5:
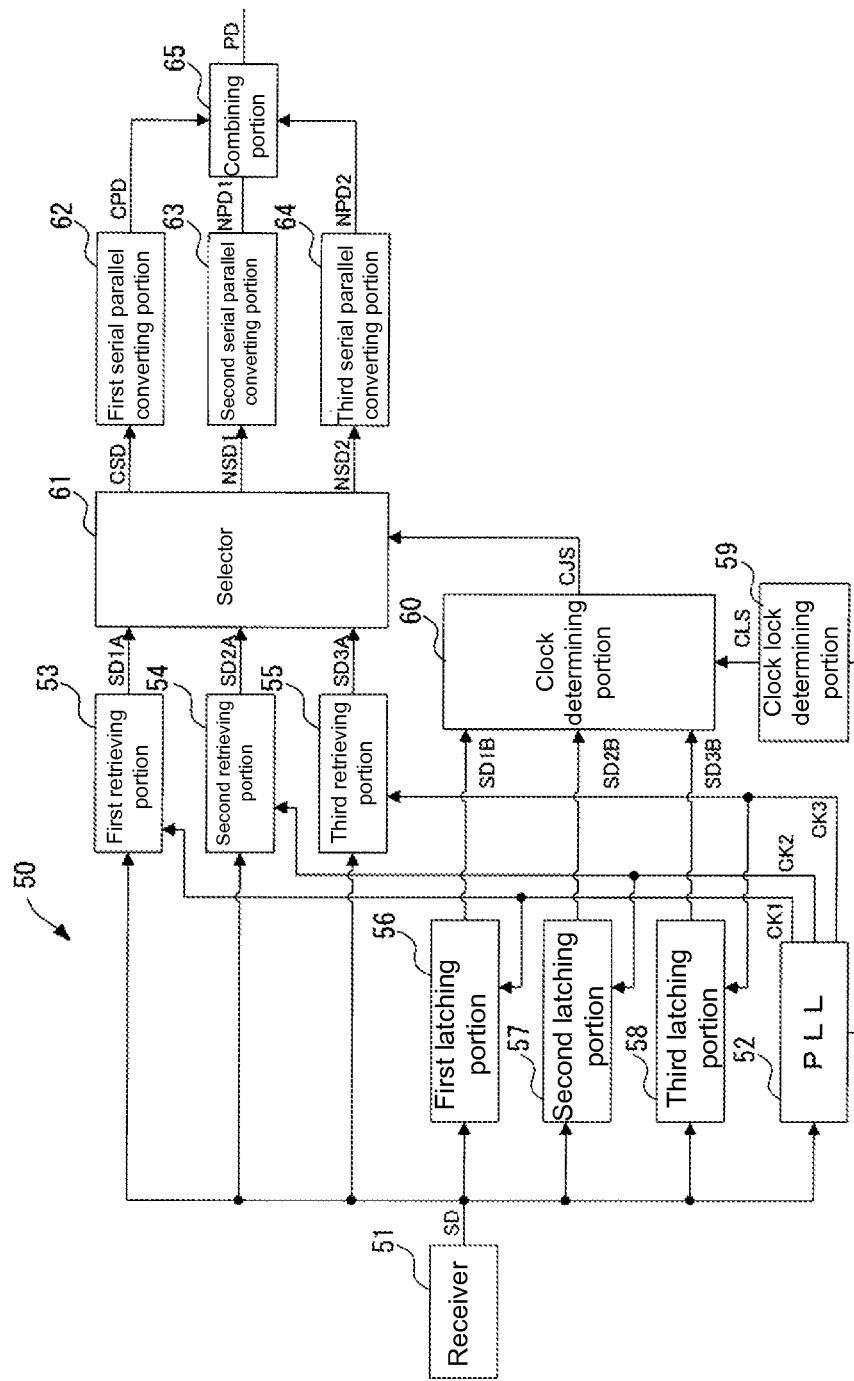
FIG. 5 is a block diagram showing a configuration of a data processing apparatus according to a third embodiment of the present invention.

A third embodiment of the present invention will be explained next. FIG. 5 is a block diagram showing a configuration of a data processing apparatus 50 according to the third embodiment of the present invention.

As shown in FIG. 5, the data processing apparatus 50 includes a receiver 51 as an inputting portion for receiving a serial data; a phase locked loop (PLL) circuit 52 as a clock signal generating portion; a first retrieving portion 53; a second retrieving portion 54; a third retrieving portion 55; a first latching portion 56; a second latching portion 57; a third latching portion 58; a clock lock determining portion 59; a clock determining portion 60; a selector 61 as a connecting switching portion; a first serial parallel converting portion 62; a second serial parallel converting portion 63; a third serial parallel converting portion 64; and a combining portion 65.

In the third embodiment, the receiver 51 is configured to receive a signal transmitted from an external transmission device (not shown) and the like, so that the receiver 11 obtains the serial data SD having a sequence of the serial data blocks DB and including the clock bit AD. For example, when each of the serial data blocks DB is 12 bits, each of the serial data blocks DB is formed of the clock bit AD and 11 bits of data sequence (B1, B2, B3, B4, B5, B6, B7, B8, B9, B10, and B11). Further, the receiver 51 is configured to supply the serial data SD to the PLL circuit 52, the first retrieving portion 53, the second retrieving portion 54, the third retrieving portion 55, the first latching portion 56, the second latching portion 57, and the third latching portion 58.

In the second embodiment, the PLL circuit 52 is configured to generate the first clock signal CK1 having a phase synchronized with that of the clock bit AD in the serial data SD supplied from the receiver 51, and to generate the second clock signal CK2 and a third clock signal CK3. The second clock signal CK2 and the third clock signal CK3 have a phase different from that of the first clock signal CK1. The PLL circuit 52 generates the second clock signal CK2 and the third clock signal CK3 through, for example, shifting the phase of the first clock signal CK1. Further, the PLL circuit 52 is configured to supply the first clock signal CK1 to the first retrieving portion 53 and the first latching portion 56, to supply the second clock signal CK2 to the second retrieving portion 54 and the second latching portion 57, and to supply the third clock signal CK3 to the third retrieving portion 55 and the third latching portion 58.

In the third embodiment, the first retrieving portion 53, the second retrieving portion 54, and the third retrieving portion 55 are configured to alternately (in order) retrieve the data sequence constituting each of the serial data blocks DB in the serial data SD per one bit according to the first clock signal CK1, the second clock signal CK2, and the third clock signal CK3, respectively. Then, the first retrieving portion 53, the second retrieving portion 54, and the third retrieving portion 55 are configured to sequentially supply the data sequence to the selector 61.

More specifically, after the rising edge of the clock bit AD in the serial data SD appears, one of the first retrieving portion 53, the second retrieving portion 54, and the third retrieving portion 55 retrieves the data according to one of the first clock signal CK1, the second clock signal CK2, and the third clock signal CK3 with the rising edge appearing first. For example, after the rising edge of the clock bit AD in the serial data SD appears, when the rising edge of the first clock signal CK1 appears before the rising edges of the second clock signal CK2 and the third clock signal CK3, the first retrieving portion 53 is configured to sequentially retrieve the clock bit AD and the bits B3, B6, and B9 among the data sequences constituting the serial data blocks DB. Then, the first retrieving portion 13 is configured to supply the clock bit AD and the bits B3, B6, and B9 to the selector 61. Similarly, the second retrieving portion 54 is configured to sequentially retrieve the bits B1, B4, B7, and B10 among the data sequences constituting the serial data blocks DB. Then, the second retrieving portion 54 is configured to supply the bits B1, B4, B7, and B10 to the selector 61.

On the other hand, after the rising edge of the clock bit AD in the serial data SD appears, when the rising edge of the second clock signal CK2 appears before the rising edges of the first clock signal CK1 and the third clock signal CK3, the second retrieving portion 54 is configured to sequentially retrieve the clock bit AD and the bits B3, B6, and B9 among the data sequences constituting the serial data blocks DB. Then, the second retrieving portion 54 is configured to supply the clock bit AD and the bits B3, B6, and B9 to the selector 61. Similarly, the third retrieving portion 55 is configured to sequentially retrieve the bits B1, B4, B7, and B10 among the data sequences constituting the serial data blocks DB. Then, the second retrieving portion 54 is configured to supply the bits B1, B4, B7, and B10 to the selector 61. Similarly, the first retrieving portion 53 is configured to sequentially retrieve the bits B2, B5, B8, and B11 among the data sequences constituting the serial data blocks DB. Then, the first retrieving portion 53 is configured to supply B2, B5, B8, and B11 to the selector 61.

Further, after the rising edge of the clock bit AD in the serial data SD appears, when the rising edge of the third clock signal CK3 appears before the rising edges of the first clock signal CK1 and the second clock signal CK2, the third retrieving portion 55 is configured to sequentially retrieve the clock bit AD and the bits B3, B6, and B9 among the data sequences constituting the serial data blocks DB. Then, the third retrieving portion 55 is configured to supply the clock bit AD and the bits B3, B6, and B9 to the selector 61. Similarly, the first retrieving portion 53 is configured to sequentially retrieve the bits B1, B4, B7, and B10 among the data sequences constituting the serial data blocks DB. Then, the first retrieving portion 53 is configured to supply the bits B1, B4, B7, and B10 to the selector 61. Similarly, the second retrieving portion 54 is configured to sequentially retrieve the bits B2, B5, B8, and B11 among the data sequences constituting the serial data blocks DB. Then, the second retrieving portion 54 is configured to supply B2, B5, B8, and B11 to the selector 61.

In the third embodiment, the first latching portion 56, the second latching portion 57, and the third latching portion 58 are configured to alternately latch the data sequence constituting each of the serial data blocks DB in the serial data SD per one bit according to the first clock signal CK1, the second clock signal CK2, and the third clock signal CK3, respectively. Then, the first latching portion 56, the second latching portion 57, and the third latching portion 58 are configured to sequentially supply the data sequence to the clock determining portion 60.

More specifically, in the third embodiment, similar to the first retrieving portion 53, the second retrieving portion 54, and the third retrieving portion 55, after the rising edge of the clock bit AD in the serial data SD appears, one of the first latching portion 56, the second latching portion 57, and the third latching portion 58 latches the data according to one of the first clock signal CK1, the second clock signal CK2, and the third clock signal CK3 with the rising edge appearing first. Through the operation described above, the first latching portion 56 supplies the serial data SD1B formed of the data latched with the first latching portion 56 to the clock determining portion 60. Similarly, the second latching portion 57 supplies the serial data SD2B formed of the data latched with the second latching portion 57 to the clock determining portion 60. Similarly, the third latching portion 58 supplies a serial data SD3B formed of the data latched with the third latching portion 58 to the clock determining portion 60.

In the third embodiment, the clock lock determining portion 59 is configured to generate the clock lock signal CLS representing whether the PLL circuit 52 is generating the first clock signal CK1 (or the second clock signal CK2 or the third clock signal CK3) with the phase thereof locked to that of the clock bit AD. Further, the clock lock determining portion 59 is configured to supply the clock lock signal CLS to the clock determining portion 60.

In the third embodiment, the clock determining portion 60 is configured to determine which of the serial data SD1B supplied from the first latching portion 56, the serial data SD2B supplied from the second latching portion 57, or the serial data SD3B supplied from the third latching portion 58 contains the clock bit AD according to the clock lock signal CLS indicating that the phase is locked.

It should be noted that the serial data SD1A and the serial data SD1B are obtained through latching (retrieving) the data sequence constituting the serial data SD according to the first clock signal CK1. Further, the serial data SD2A and the serial data SD2B are obtained through latching (retrieving) the data sequence constituting the serial data SD according to the second clock signal CK2. Further, the serial data SD3A and the serial data SD3B are obtained through latching (retrieving) the data sequence constituting the serial data SD according to the third clock signal CK3. Accordingly, when the clock determining portion 60 determines that the clock bit AD is contained in the serial data SD1B, it would be equivalent to the clock determining portion 60 determining that the clock bit AD is contained in the serial data SD1A. Similarly, when the clock determining portion 60 determines that the clock bit AD is contained in the serial data SD2B, it would be equivalent to the clock determining portion 60 determining that the clock bit AD is contained in the serial data SD2A. Similarly, when the clock determining portion 60 determines that the clock bit AD is contained in the serial data SD3B, it would be equivalent to the clock determining portion 60 determining that the clock bit AD is contained in the serial data SD3A.

More specifically, in the third embodiment, the clock determining portion 60 determines whether the serial data SD1A, the serial data SD2A, or the serial data SD3A contains the clock bit AD according to whether the serial data SD1A, the serial data SD2A, or the serial data SD3A contains the clock bit AD. Afterward, the clock determining portion 60 supplies the clock determining signal CJS indicating that one of the serial data SD1A (the serial data SD1B), the serial data SD2A (the serial data SD2B), or the serial data SD3A (the serial data SD3B) contains the clock bit AD to the selector 61.

In the third embodiment, after the clock determining portion 60 determines that one of the serial data SD1A, the serial data SD2A, and the serial data SD3A contains the clock bit AD, the selector 61 is configured to supply the one of the serial data SD1A, the serial data SD2A, and the serial data SD3A as the serial data CSD to the first serial parallel converting portion 62 according to the clock determining signal CJS. Further, the selector 61 is configured to supply one of the two data of the serial data SD1A, the serial data SD2A, and the serial data SD3A not containing the clock bit AD as a serial data NSD1 to the second serial parallel converting portion 63. Further, the selector 61 is configured to supply the other one of the two data of the serial data SD1A, the serial data SD2A, and the serial data SD3A not containing the clock bit AD as a serial data NSD2 to the third serial parallel converting portion 64.

In the third embodiment, the first serial parallel converting portion 62 is configured to perform serial parallel conversion to the serial data CSD containing the clock bit AD and supplied from the selector 61. Accordingly, the first serial parallel converting portion 62 generates the parallel data CPD containing the clock bit AD, and supplies the parallel data CPD to the combining portion 65. Similarly, the second serial parallel converting portion 63 is configured to perform serial parallel conversion to the serial data NSD1 not containing the clock bit AD and supplied from the selector 61. Accordingly, the second serial parallel converting portion 63 generates a parallel data NPD1 not containing the clock bit AD, and supplies the parallel data NPD1 to the combining portion 65. Similarly, the third serial parallel converting portion 64 is configured to perform serial parallel conversion to the serial data NSD2 not containing the clock bit AD and supplied from the selector 61. Accordingly, the second serial parallel converting portion 63 generates a parallel data NPD2 not containing the clock bit AD, and supplies the parallel data NPD2 to the combining portion 65.

It should be noted that there is a specific time difference (a delay) between the serial parallel conversion performed to the serial data CSD containing the clock bit AD and the serial parallel conversion performed to the serial data NSD1 and the serial data NSD2 not containing the clock bit AD. To this end, the first serial parallel converting portion 62, the second serial parallel converting portion 63, and the third serial parallel converting portion 64 are configured to adjust the delay in the processing time, so that the first serial parallel converting portion 62, the second serial parallel converting portion 63, and the third serial parallel converting portion 64 supply the parallel data CPD, the parallel data NPD1, and the parallel data NPD2 to the combining portion 65 at the same timing.

In the third embodiment, the combining portion 65 is configured to combine the parallel data CPD without the clock bit AD, the parallel data NPD1 not containing the clock bit AD and supplied from the second serial parallel converting portion 63, and the parallel data NPD2 not containing the clock bit AD and supplied from the third serial parallel converting portion 64, and output as a parallel data PD.

As described above, in the third embodiment, the data processing apparatus 50 includes the three retrieving portions, i.e., the first retrieving portion 53, the second retrieving portion 54, and the third retrieving portion 55, and the three serial parallel converting portions. i.e., the first serial parallel converting portion 62, the second serial parallel converting portion 63, and the third serial parallel converting portion 64. Accordingly, the first retrieving portion 53, the second retrieving portion 54, and the third retrieving portion 55 alternately retrieve the serial data SD in the three paths. Then, the first serial parallel converting portion 62, the second serial parallel converting portion 63, and the third serial parallel converting portion 64 perform the serial parallel conversion in parallel. Accordingly, as compared with the data processing apparatus 10 and the data processing apparatus 30 in the first and second embodiments, it is possible to perform the serial parallel conversion at a further slower speed. As a result, it is possible to reduce an influence of the skew caused by the delay in latching.

As described above, in the data processing apparatus 10, the data processing apparatus 30, and the data processing apparatus 50 in the first to third embodiments, the serial data SD is divided and retrieved in a plurality of paths. After the serial parallel conversion is performed to the data in parallel, the data is combined. Accordingly, it is possible to perform the serial parallel conversion at a slower speed. As a result, it is possible to reduce an influence of the skew caused by the delay in latching.

Further, in the data processing apparatus 10, the data processing apparatus 30, and the data processing apparatus 50 in the first to third embodiments, the clock determining portion 18, the clock determining portion 36, and the clock determining portion 60 determine in advance which of the data retrieved a plurality of paths contains the clock bit AD. Then, the first serial parallel converting portion 20, the second serial parallel converting portion 21, the first serial parallel converting portion 38, the second serial parallel converting portion 39, the first serial parallel converting portion 62, the second serial parallel converting portion 63, and the third serial parallel converting portion 64 perform the serial parallel conversion to the data containing the clock bit AD and the data not containing the clock bit AD. After the delay in the serial parallel conversion to the data containing the clock bit AD and the data not containing the clock bit AD is adjusted, the data is supplied to the combining portion 22, the combining portion 40, and the combining portion 65. Accordingly, it is not necessary to adjust the delay while determining which of the data contains the clock bit AD one more time after the serial parallel conversion. As a result, it is possible to smoothly process the data.

It should be noted that the present invention is not limited to the configurations in the first to third embodiments, and the present invention may be applicable to other configurations. For example, the retrieving portions and the serial parallel converting portions may be disposed in more than four paths, so that the serial parallel conversion can be perform in more than four paths in parallel. Accordingly, it is possible to perform the serial parallel conversion at a further slower speed.

Further, in the data processing apparatus 10, the data processing apparatus 30, and the data processing apparatus 50 in the first to third embodiments, after the first serial parallel converting portion 20, the second serial parallel converting portion 21, the first serial parallel converting portion 38, the second serial parallel converting portion 39, the first serial parallel converting portion 62, the second serial parallel converting portion 63, and the third serial parallel converting portion 64 perform the specific delay adjustment process, the data is supplied to the combining portion 22, the combining portion 40, and the combining portion 65. The present invention is not limited thereto, and an adjustment circuit may be provided for performing the delay adjustment process. More specifically, according to the present invention, it is suffice to configure such that the delay caused between the processing of the data containing the clock bit AD and the processing of the data not containing the clock bit AD is adjusted.

Further, in the first to third embodiments, the data processing apparatus 10, the data processing apparatus 30, and the data processing apparatus 50 are configured to process the serial data SD having the sequence of the serial data blocks DB with 10 bits or 12 bits containing the clock bit AD. The present invention is not limited thereto, and is applicable to a data processing apparatus configured to process the serial data SD having the sequence of the serial data blocks DB with a plurality of bits containing the clock bit AD.

Further, in the first embodiment, the first retrieving portion 13 is configured to sequentially retrieve the clock bit AD and the bits B2, B4, B6, and B8 assigned with even numbers. Similarly, the second retrieving portion 14 is configured to sequentially retrieve the bits B1, B3, B5, B7, and B9 assigned with odd numbers. Then, the serial parallel conversion is performed to the data in parallel. It should be noted that the selection of the data to be retrieved in each path is not limited thereto.

According to the present invention, the inputting portion is configured to receive the serial data formed of the sequence of the serial data blocks of N bits (N is a natural number greater than 2) and including the clock bit. The first retrieving portion is configured to retrieve and obtain the data of K bits (K is a natural number greater than N, K>N) from each of the serial data blocks as the first retrieved data. The second retrieving portion is configured to retrieve and obtain the data of L bits (L is a difference between N and K, L=K−N) from each of the serial data blocks as the second retrieved data. The clock determining portion is configured to determine whether the clock bit is included in one of the first retrieved data and the second retrieved data.

Further, according to the present invention, the first serial parallel converting portion is configured to perform the parallel conversion to one of the first retrieved data and the second retrieved data that includes the clock bit, so that the first serial parallel converting portion obtains the first parallel data. The second serial parallel converting portion is configured to perform parallel conversion to the other one of the first retrieved data and the second retrieved data that does not include the clock bit, so that the second serial parallel converting portion obtains the second parallel data. The combining portion is configured to combine the first parallel data and the second parallel data to generate the parallel data of N bits.

The disclosure of Japanese Patent Application No. 2014-182024, filed on Sep. 8, 2014, is incorporated in the application by reference.

While the invention has been explained with reference to the specific embodiments of the invention, the explanation is illustrative and the invention is limited only by the appended claims.

What is claimed is:

1. A data processing apparatus, comprising:
an inputting circuit that receives a serial data formed of a sequence of serial data blocks of N bits (N is a natural number greater than 2) and including a clock bit;
a first retrieving circuit that retrieves and obtains a data of K bits (K is a natural number greater than N, K>N) from each of the serial data blocks as a first retrieved data;
a second retrieving circuit that retrieves and obtains a data of L bits (L is a difference between N and K, L=K−N) from each of the serial data blocks as a second retrieved data;
a clock determining circuit that determines whether the clock bit is included in one of the first retrieved data and the second retrieved data;
a first serial parallel converting circuit that performs parallel conversion to one of the first retrieved data and the second retrieved data that includes the clock bit according to a determination result of the clock determining portion so that the first serial parallel converting circuit obtains a first parallel data;

a second serial parallel converting circuit that performs parallel conversion to the other one of the first retrieved data and the second retrieved data that does not include the clock bit according to the determination result of the clock determining portion so that the second serial parallel converting circuit obtains a second parallel data; and a combining circuit that combines the first parallel data and the second parallel data to output a parallel data of N bits.

2. The data processing apparatus according to claim 1, further comprising a clock signal generating circuit that generates a first clock signal and a second clock signal having a phase different from that of the first clock signal according to the serial data, wherein said first retrieving circuit retrieves the data of K bits from each of the serial data blocks according to the first clock signal, and said second retrieving circuit retrieves the data of L bits from each of the serial data blocks according to the second clock signal.

3. The data processing apparatus according to claim 1, wherein said first retrieving circuit and said second retrieving circuit alternately retrieve the data per one bit from each of the serial data blocks.

4. The data processing apparatus according to claim 1, further comprising a first latching circuit that latches the data of K bits from each of the serial data blocks, and supplies a first latch data to the clock determining portion; and a second latching circuit that latches the data of L bits from each of the serial data blocks, and supplies a second latch data to the clock determining portion, wherein said clock determining circuit determines whether the clock bit is included in the one of the first retrieved data and the second retrieved data according to the first latch data and the second latch data.

5. The data processing apparatus according to claim 1, wherein said combining circuit removes the clock bit from the first parallel data to obtain the first parallel data without the clock bit, and said combining circuit combines the first parallel data without the clock bit and the second parallel data to output the parallel data of N bits.

6. A method of processing data, comprising:
an input receiving step, in which a serial data formed of a sequence of serial data blocks of N bits (N is a natural number greater than 2) and including a clock bit is received;
a first retrieving step, in which a data of K bits (K is a natural number greater than N, K>N) is retrieved and obtained from each of the serial data blocks as a first retrieved data;
a second retrieving step, in which a data of L bits (L is a difference between N and K, L=K−N) is retrieved and obtained from each of the serial data blocks as a second retrieved data;
a clock determining step, in which it is determined whether the clock bit is included in one of the first retrieved data and the second retrieved data;
a first serial parallel converting step, in which parallel conversion is performed to one of the first retrieved data and the second retrieved data that includes the clock bit according to a determination result of the clock determining step so that a first parallel data is obtained;

a second serial parallel converting step, in which parallel conversion is performed to the other one of the first retrieved data and the second retrieved data that does not include the clock bit according to the determination result of the clock determining step so that a second parallel data is obtained; and a combining step, in which the first parallel data and the second parallel data are combined, and a parallel data of N bits is output.

7. The method of processing data according to claim 6, further comprising a clock signal generating step, in which a first clock signal and a second clock signal having a phase different from that of the first clock signal are generated according to the serial data, wherein, in the first retrieving step, said data of K bits is retrieved from each of the serial data blocks according to the first clock signal, and in the second retrieving step, said data of L bits is retrieved from each of the serial data blocks according to the second clock signal.

8. The method of processing data according to claim 6, wherein said first retrieving step and said second retrieving step are conducted alternately to retrieve the data per one bit from each of the serial data blocks.

9. The method of processing data according to claim 6, further comprising a first latching step of latching the data of K bits from each of the serial data blocks, and of supplying a first latch data to the clock determining step; and a second latching step of latching the data of L bits from each of the serial data blocks, and of supplying a second latch data to the clock determining step, wherein in the clock determining step, it is to determine whether the clock bit is included in the one of the first retrieved data and the second retrieved data according to the first latch data and the second latch data.

10. The method of processing data according to claim 6, wherein in the combining step, said clock bit is removed from the first parallel data to obtain the first parallel data without the clock bit, and said first parallel data without the clock bit and said second parallel data are combined to output the parallel data of N bits.

11. A data processing apparatus, comprising:
an inputting circuit that receives a serial data formed of a sequence of serial data blocks of a plurality of bits and including a clock bit;
a plurality of retrieving circuits that retrieve and obtain a data from each of the serial data blocks as a plurality of retrieved data;
a clock determining circuit that determines whether the clock bit is included in one of the retrieved data;
a first serial parallel converting circuit that performs parallel conversion to one of the retrieved data that includes the clock bit according to a determination result of the clock determining circuit so that the first serial parallel converting circuit obtains a first parallel data;
a plurality of second serial parallel converting circuits that perform parallel conversion to the other ones of the retrieved data that do not include the clock bit according to the determination result of the clock determining circuit so that the second serial parallel converting circuits obtain a plurality of second parallel data; and
a combining circuit that combines the first parallel data and the second parallel data to output a parallel data.

12. The data processing apparatus according to claim 11, further comprising a clock signal generating circuit that generates a plurality of clock signals having phases different from each other according to the serial data,
   wherein said retrieving circuits retrieve the data according to one of the clock signals.

13. The data processing apparatus according to claim 11, further comprising a plurality of latching circuits that latch the data from each of the serial data blocks, and to obtain a plurality of latch data,
   wherein said clock determining circuit determines whether the clock bit is included in the one of the retrieved data according to the latch data.

14. The data processing apparatus according to claim 11, wherein said combining circuit removes the clock bit from the first parallel data to obtain the first parallel data without the clock bit, and
   said combining circuit combines the first parallel data without the clock bit and the second parallel data.

* * * * *